US012270715B2

(12) United States Patent
Degrenne et al.

(10) Patent No.: US 12,270,715 B2
(45) Date of Patent: Apr. 8, 2025

(54) METHOD FOR ESTIMATING PARAMETERS OF A JUNCTION OF A POWER SEMI-CONDUCTOR ELEMENT AND POWER UNIT

(71) Applicant: Mitsubishi Electric Corporation, Tokyo (JP)

(72) Inventors: Nicolas Degrenne, Rennes (FR); Nicolas Voyer, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 379 days.

(21) Appl. No.: 17/781,220

(22) PCT Filed: Oct. 23, 2020

(86) PCT No.: PCT/JP2020/040733
§ 371 (c)(1),
(2) Date: May 31, 2022

(87) PCT Pub. No.: WO2021/124707
PCT Pub. Date: Jun. 24, 2021

(65) Prior Publication Data
US 2023/0003586 A1      Jan. 5, 2023

(30) Foreign Application Priority Data

Dec. 20, 2019 (EP) ...................... 19306719

(51) Int. Cl.
*G01K 7/01* (2006.01)
*G01K 7/42* (2006.01)
(Continued)

(52) U.S. Cl.
CPC ............... *G01K 7/01* (2013.01); *G01K 7/427* (2013.01); *G01K 15/005* (2013.01);
(Continued)

(58) Field of Classification Search
CPC ........ G01K 7/01; G01K 7/427; G01K 15/005; G01R 31/2607; G01R 31/2628;
(Continued)

(56) References Cited

U.S. PATENT DOCUMENTS

| 2009/0012739 A1* | 1/2009 | Flett ........................ G01K 7/42 |
| | | 702/130 |
| 2011/0150028 A1* | 6/2011 | Nguyen Hoang ..... H05B 45/56 |
| | | 374/1 |

(Continued)

OTHER PUBLICATIONS

Rannestad et al., "Virtual Temperature Detection of Semiconductors in a Megawatt Field Converter", IEEE Transactions on Industrial Electronics, Feb. 2020, vol. 67, No. 2, p. 1305-1315.

*Primary Examiner* — Raul J Rios Russo
(74) *Attorney, Agent, or Firm* — Birch, Stewart, Kolasch & Birch, LLP

(57) ABSTRACT

The present disclosure relates to a method for estimating parameters of a junction of a power semi-conductor element comprising: •—Detecting at least one stable on-line operating condition through measurements (2, 3, 4) of Von, Ion, Tc on a semi-conductor module (1) where Ion is a current for which the on-state voltage Von of the semi-conductor is sensitive to the temperature and Tc is the temperature of the casing of said semi-conductor element; •—Measuring and storing at least one parameter set Von, Ion, Tc of said at least one stable operating condition; •—in a calculating unit (52), providing calculations for minimizing the error between a junction temperature estimation Tj of an electrical model Tj=F(Von, Ion, θelec) comprising a first set of unknown parameters θelec and another junction temperature estimation Tjmod of a loss/thermal model Tj=G(Ion, Tc, θ mod) comprising a second set of unknown parameters θ mod and obtaining at least one set of parameters θelec and at least one parameter θ mod providing minimization of said error;

(Continued)

•—providing the calculated value of Tj with at least one of the calculated parameters sets θelec and/or θ mod and the measured Von, Ion, Tc; •—Storing the at least one parameters set θelec and/or θ mod and/or Tj.

18 Claims, 4 Drawing Sheets

(51) Int. Cl.
   *G01K 15/00* (2006.01)
   *G01R 31/26* (2020.01)
(52) U.S. Cl.
   CPC ...... *G01R 31/2607* (2013.01); *G01R 31/2619* (2013.01); *G01R 31/2628* (2013.01)
(58) Field of Classification Search
   CPC ............ G01R 31/2632; G01R 31/2642; G01R 31/2817; G01R 31/40; G01R 31/2619
   USPC .................................................... 324/762.01
   See application file for complete search history.

(56) References Cited

U.S. PATENT DOCUMENTS

| | | | | |
|---|---|---|---|---|
| 2011/0157944 | A1* | 6/2011 | Jiang .................. | G05D 23/1935 |
| | | | | 327/427 |
| 2020/0256912 | A1* | 8/2020 | Degrenne .............. | G01R 31/26 |
| 2021/0223307 | A1* | 7/2021 | Degrenne .......... | G01R 31/2642 |
| 2023/0003586 | A1* | 1/2023 | Degrenne .............. | G01K 7/427 |

* cited by examiner

METHOD FOR ESTIMATING PARAMETERS OF A JUNCTION OF A POWER SEMI-CONDUCTOR ELEMENT AND POWER UNIT

TECHNICAL FIELD

This disclosure relates to a method for estimating parameters of the junction of a power semi-conductor such as IGBT, Diode, MOSFET modules in equipment such as power converters in order to provide a survey of such parameters in order to provide a monitoring of the temperature of the junction and/or of the condition and possible degradation of such semi-conductor in a monitoring system.

BACKGROUND ART

Estimation of parameters such as semi-conductor junction temperature is important for diagnostics and prognostics of power semi-conductor modules.

Temperature estimation of a power semi-conductor module based on a thermal model is attractive because it provides a temperature estimate for all operating conditions of such module. However, such estimation requires an accurate power loss measurement of the power semi-conductor module and an accurate thermal model of the power semi-conductor module and cooling assembly, which is very difficult to establish a-priori because of sensibility and variability of such model with mounting and operating conditions. In addition, the thermal impedance of a module evolves with power module ageing, making such estimation un-reliable.

Temperature estimation based on a voltage Von as a Temperature Sensitive Electrical Parameter (TSEP) is attractive because it applies to both IGBTs, diodes, and MOSFETs, because it does not require modification of operation or gate signal, and because measurement is performed at low-speed (several µs range) between commutations. However, estimation is not possible or too costly to perform for all operating points because of Zero Temperature Coefficient (ZTC) current regions, and/or influence of parasitic elements at high current and/or extensive calibration requirements.

Von is for example the cathode to anode voltage, or the drain to source voltage or the collector to emitter voltage.

The problem associated with ZTC is fundamental but can be managed by performing the temperature measurement at other current values. The problem associated with the influence of parasitic elements can be minimized by performing the calibration with on-line data, so that parasitic elements are considered in the calibration data itself and thus partially compensated for. Regular re-calibration can detect device ageing (condition monitoring) and compensate for this ageing in the estimation of the junction temperature. In case of re-calibration with on-line data, the normal operation does not need to be interrupted during re-calibration. Finally, calibration with on-line data can also reduce the associated cost because no special routine is required at the end of the production line or during the life of the product, with special dedicated diagnostic procedures which impact the normal operation of the converter.

However, calibration with on-line data for Von as a TSEP is particularly difficult due to the dependence of Von on the load current primarily.

In inverters or rectifiers, where the load current is sinusoidal, the calibration may use the possibility to measure Von at currents Imeasure that are different and independent of the RMS or peak load current Irms and Ipk. In the case of DC/DC converters where the measurement current is strongly constrained and linked to the peak or RMS current, on-line calibration is even more difficult.

Document B. Rannestad, K. Fischer, P. Nielsen, K. Gadgaard, and S. Munk-nielsen, "Virtual Temperature Detection of Semi-conductors in a Mega Watt Field Converter;" IEE TRANSACTIONS ON INDUSTRIAL ELECTRONICS vol. 0067, no. 2, FEBRUARY 2020 discloses a method using a virtual temperature defined and proposed as a parameter for condition monitoring in power modules in field applications. However, calibrating a monitoring model using on-line voltage, current and temperature remains a challenge that is addressed by the present invention.

SUMMARY OF INVENTION

The problem addressed by the present invention is therefore to provide an estimation of parameters in the relation between Tj the temperature of the junction of a power semi-conductor, and the voltage Von and current Ion respectively across and through such power semi-conductor in order to survey the semi-conductor health during its life.

The invention comprises a calibration method that provides initial parameters of said relation and an analysis of the evolution of these parameters through further estimations during normal working conditions permitting an estimation of the degradation and/or an estimation of the junction temperature of a power semi-conductor (IGBT, Diode, MOSFET) or a power semi-conductor module.

The invention targets specifically to provide calibration and estimation performed with data acquired on-line, that means obtained during the normal operation of the converter, where the converter can be a DC/DC or a DC/AC type, and where the current is varying with operating conditions and/or sinusoidal.

More precisely, the present disclosure proposes a method for estimating parameters of the junction of a semi-conductor element comprising:

Detecting at least one stable on-line operating condition through measurements of Von, Ion, Tc on a semi-conductor module where Ion is a current for which the on-state voltage Von of the semi-conductor is sensitive to the temperature and Tc is the temperature of the casing of said semi-conductor element;

Measuring and storing at least one set of parameters Von, Ion, Tc of said at least one stable operating condition;

in a calculating unit, providing calculations for minimizing the error between a junction temperature estimation Tj of an electrical model Tj=F(Von, Ion, θelec) comprising a first set of unknown parameters θelec and another junction temperature estimation Tjmod of a loss/thermal model Tjmod=G(Ion, Tc, θ mod) comprising a second set of unknown parameters θ mod and obtaining at least one set of parameters θelec and at least one set of parameters θ mod providing minimization of said error;

providing the calculated value of Tj with at least one of the calculated sets of parameters θelec and/or θ mod and the measured Von, Ion, Tc;

Storing the at least one set of parameters θelec and/or θ mod and/or Tj.

The method provides an estimation of the junction temperature on the basis of simple on-line measurements external to the semi-conductor die.

In realization modes which may combined or alternatives:

Said method may comprise an algorithm that scans various combinations of said sets of parameters and select the combination that presents an error E lower than a defined limit value.

Said method may comprise providing a set of N on-line Von, Ion, Tc, Irms measurements sufficient to generate a system of N equations where N is greater than or equal to the number of parameters of θelec+θ mod and comprising calculating the unknowns θelec through an analytical calculation algorithm that solves the N equations.

The method may be such as the estimated sets of parameters minimize the sum, over a set of P on-line measurements, of square errors between said electrical model and said loss/thermal model.

The method may then comprise:
Initializing a uniform vector during a first measurement in absence of power, Computing, incrementing and storing moments of correlation between the on-line measurements;
Identifying the estimated parameters as the product of the inverse matrix of the moments of correlation with said uniform vector.

Tj in the electrical model may be of the form:

$$Tj = T0 + \frac{Von - V0}{a}$$

The thermal model may be of the form:

$$Tj\ \text{mod} = H(Irms) + Tc$$

where $T0$ is a reference temperature, $V0$ is the Von voltage at said reference temperature $T0$, "a" is the temperature sensitivity of Von, $Tj$ is the die temperature of the power semi-conductor, $H$ is a general Tjmod equation according to the power semi-conductor used, Irms is estimated from Ion and Tc is measured.

The electrical model may be of the form $Tj = T0 + \alpha_{Ion} \cdot (Von - V0_{Ion})$ measured at a certain Ion, the method comprising a calibration method to estimate the parameters $\alpha_{Ion}$ and $V0_{Ion}$ of the electrical model, where $\alpha_{Ion}$ is the temperature sensitivity of Von for a pre-defined current Ion and $V0_{Ion}$ is the voltage at a pre-defined reference temperature $T0$ and said pre-defined current Ion.

The temperature sensitivity may be defined for N currents Ion; (i=1:N) and for M sets of measurements where M≥N, and where the method comprises identification of the $V0_i$ (i=1:N) by minimizing the error between Tj estimated by the electrical model and by Tj estimated by said thermal model.

The method may comprise an estimation of a voltage V0 using at least two measurements at the same current but different operating conditions wherein at least two sets (Von1, Ion1, Tc1, Irms1) and (Von2, Ion2, Tc2, Irms2) are monitored with Ion1=Ion2, Tc1≠Tc2, and Irms1≠Irms2, and where a parameter of θelec is the value V0 of Von at the current Ion=Ion1=Ion2 and at a pre-defined temperature value T0 and wherein the monitoring is performed with the following protocol:
Detecting a first moment when the load current equals the pre-defined current Ion=Ion1, and saving a first Von1 at this first moment;
Detecting at least a second moment when the load current equals the pre-defined current Ion=Ion2=Ion1, the case temperature Tc2=Tc1, and Von at this different moment is different than Von measured at the first moment, and saving a second Von at this second moment.

The current Ion being proportional with a known factor to the peak or RMS current and the loss model being expressed as a function of this peak or RMS current, the method may include generating at least two estimations that are based on the minimization of the error between the electrical model and the loss/thermal model and comprising:
estimating the temperature sensitivity of Von for at least 3 currents Ion1, Ion2, Ion3, by performing at least two times the process of selecting and using at least two sets (Von1, Ion1 proportional to Irms1, Tc1) and (Von2, Ion2 proportional to Irms2, Tc2) with Ion1=Ion2; Irms1=Irms2 and Tc1≠Tc2;
estimating the Von voltages Von01, Von02 and Von03 at the reference temperature T0 and for at least three currents Ion1, Ion2, and Ion3 by selecting and using at least three sets (Von1, Ion1 proportional to Irms1, Tc1), (Von2, Ion2 proportional to Irms2, Tc2) and (Von3, Ion3 proportional to Irms3, Tc3) where Tc1≠Tc2≠Tc3 or Irms1≠Irms2≠Irms3.

This may correspond to an estimation of V0 using three measurements at different operating conditions where the temperature sensitivity of Von: «a» is estimated in Von=V0+a·(Tj−T0) for N>2 currents and where it is possible to measure only two currents and interpolate the results to find the N>2 currents. The N«V0» are estimated for each currents in Von=V0+a·(Tj−T0) through the hypothesis on the equation V0=H(Ion) that H is linear.

The at least three currents Ion1, Ion2 and Ion3 may be chosen in a linear region of the static characteristic of the power semi-conductor switch, such that the three points (Von1, Ion1), (Von2, Ion2), and (Von3, Ion3) are positioned on a same line at a same temperature.

The disclosure concerns also a method for estimating the state of health of a power semi-conductor element comprising said method for estimating parameters of a junction of a power semi-conductor element performed at different moments in time in the life of the power semi-conductor module, where the parameters θ mod of the thermal model provide at least a parameter representing a thermal resistance Rth stored during said moments in time, and where the evolution of Rth is used to access the state of health of the power semi-conductor module.

For estimating the state of health of a power semi-conductor element the method for estimating parameters may performed at different moments in time in the life of the power semi-conductor module, comprising storing at least one parameter $V0_1$ during these moments in time, and comprising a survey of the evolution of $V0_1$ to provide a diagnosis means of state of health of the power semi-conductor module.

The disclosure concerns also a method for estimating the temperature of the junction of a semi-conductor element comprising the method for estimating parameters of a junction of a power semi-conductor element with executing a calibration at a first moment in time of working of the semi-conductor component, said calibration comprising calculating and storing a first set of $\theta elec_0$ parameters at said first moment in time and comprising computing at other moments in time the equation Tj=F(Von, Ion, θelec) with said first set of parameters $\theta elec_0$ and the on-line measurements of Von and Ion at said other moments in time to estimate the junction temperature at said other moments in time.

The temperature may also be estimated through executing a first calibration at an initial moment in time of working of the semi-conductor component, calculating and storing a first set of parameters $\theta\ \text{mod}_0$ at said initial moment in time and comprising computing, at other moments in time, the equation Tj=G(Ion, Tc, θ mod) with this set of parameters together with the on-line measurements of Von and Ion at said other moments in time and estimating the junction temperature at said other moments in time.

The equation Tj=G(Ion, Tc, θ mod) may be such as $$Tj = \frac{Von - f \cdot Ion - g}{h \cdot Ion + k} + T0$$

θ mod being the parameter set (f, g, h, k).

The present disclosure concerns also a power unit comprising a power semi-conductor device, sensors for sensing on-line Von, Ion and Tc of said semi-conductor device and a monitoring unit wherein the monitoring unit comprises an input interface for receiving measurements data from said sensors, a calculation processor and storage memory for implementing the method of the present disclosure.

The monitoring unit may comprise a measurement program that schedules calibrations and measurement operations according to the method of the disclosure during the life of the power semi-conductor to detect potentially damaging Tj values and potential failures of said semi-conductor.

DESCRIPTION OF EMBODIMENTS

Figure 1:
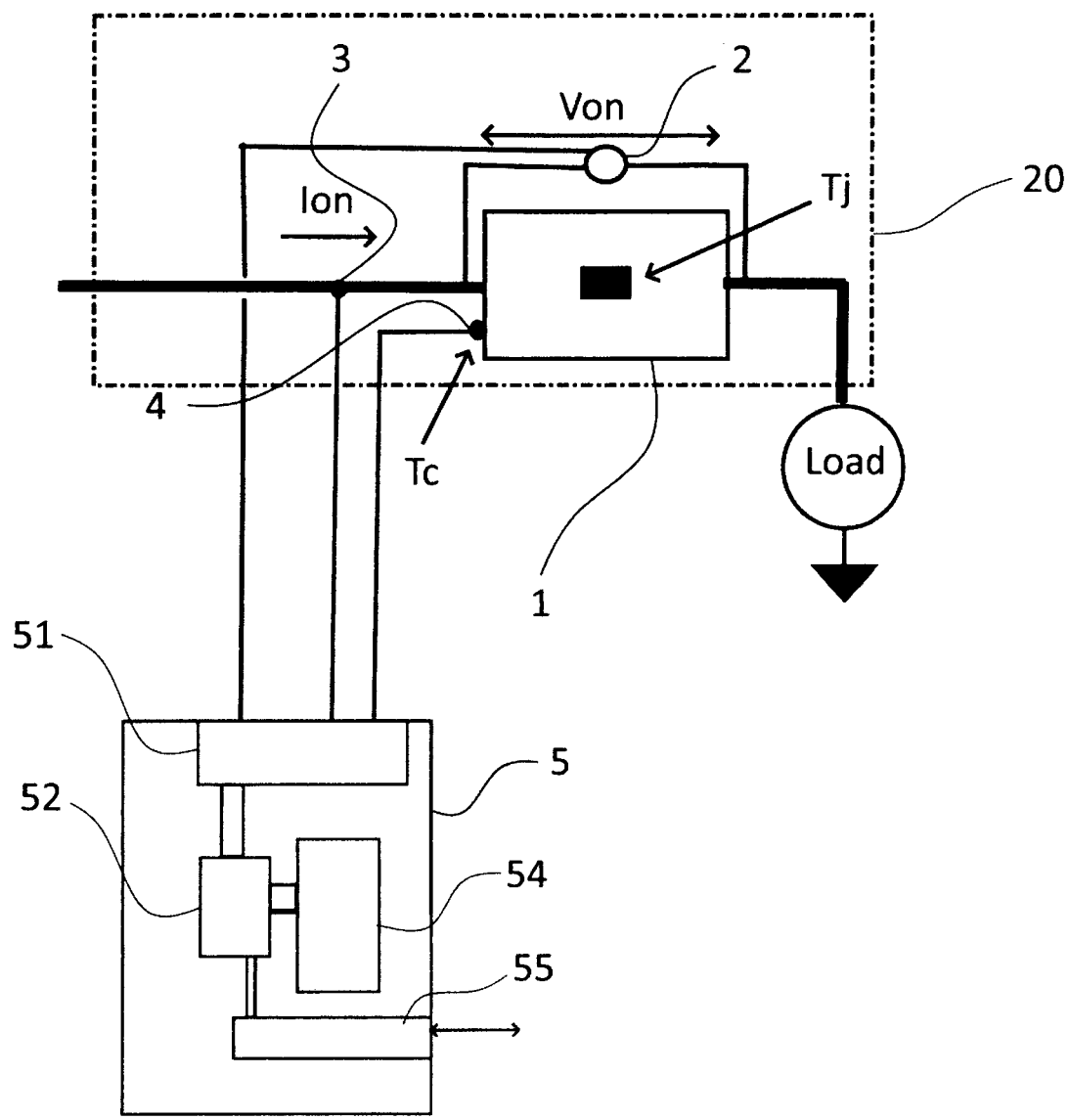
FIG. 1 is a simplified schematic of a system of the present disclosure.

The present invention provides a process for obtaining accurate temperature values during operation of a power converter component such as a semi-conductor or semi-conductor module 1 as schematically described in FIG. 1. Such process comprises one or more calibration phases and measurement phases during the on line working condition of one or more power semi-conductors or semi-conductors modules.

In its most generic form, the invention thus comprises a calibration method permitting an estimation of the degradation and/or temperature of a power semi-conductor module or component 1 of an electronic device 20 such as a current converter. It applies to various power semi-conductor devices such as an IGBT, a Diode or a MOSFET. In the case of a MOSFET, that is a bi-directional component, the temperature estimation may be performed either during its forward or reverse conduction, itself either with a high gate voltage, or a low gate voltage, i.e. during the conduction of the body-diode. The process is based on obtaining input data 10 from such limited number of signals on the power converter component 1 from sensors such as a current sensor 3 a voltage sensor 2 and a heatsink temperature sensor 4, such sensors providing input values Von, the ON voltage of a power component, Ion, the ON current of such component and Tc the temperature of the heat sink of such component to be monitored in a monitoring unit 5. The monitoring unit 5 receives the signals of the sensors with an input interface 51 such as analog to digital interface, comprises a calculation processor 52 such as a DSP, microcontroller or microprocessor which proceeds to the necessary calculations for implementing the calibration and measurements methods, comprises storage memory 54 including but not limited to non-volatile memory such as ROM, EPROM and/or data storage memory such as SSD in which the program for implementing the method may be located and volatile memory RAM where the computation data may be stored. The monitoring unit may also have a communication interface 55 such as USB, radio or any other communication interface allowing to connect a display device and/or a remote monitoring system.

A said above Von is for example the cathode to anode voltage, or the drain to source voltage or the collector to emitter voltage in a power semi-conductor or the input to output voltage in a power semi-conductor module.

Figure 2:
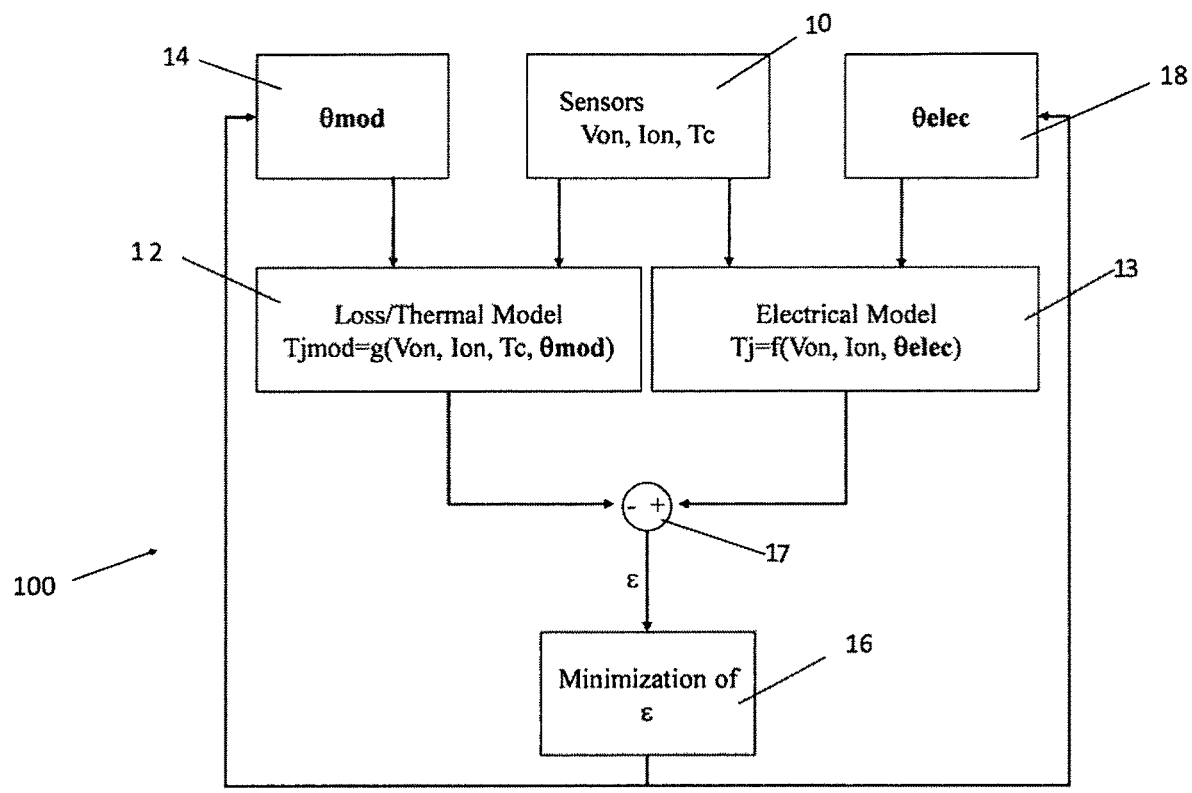
FIG. 2 is a schematic flowchart of an algorithm of the present disclosure.

The current Ion used for calibration does not need to be independent of the peak or rms load current responsible for the losses in the power semi-conductor switch. In the monitoring unit, a calibration process 100 represented in FIG. 2 is computed, such calibration process comprising on the one side computing parameters of an electrical function of an electrical model function 13 and on the other side computing parameters of a loss/thermal model 12 function to obtain a minimization of error 16 of the two functions. The electrical function F is according to the equation Tj=F (Von, Ion, θelec) which is computed in step 13 and comprises a set of unknown parameters θelec of the equation that need to be estimated during the calibration.

The thermal function is Tjmod=G(Ion, Tc, θ mod) and comprises a set of parameters θ mod that need also to be estimated during the calibration.

Once these parameters are identified through a calibration phase comprising an error minimization process 16 where the unknown parameters adapted to minimize the error at a subtraction step 17. In such process, parameters of equation F are modified to provide a minimization of error between the two models.

After a calibration θelec and/or θ mod parameters are used in order to survey the Tj temperature in several subsequent on-line measurements until a new calibration is done.

In addition, several calibration phases during the lifetime of the power module are executed in order to monitor the evolution of the θelec and/or θ mod parameters with time and detect abnormal variations of such parameters that reflect degradation of the power semi-conductor.

Figure 3:
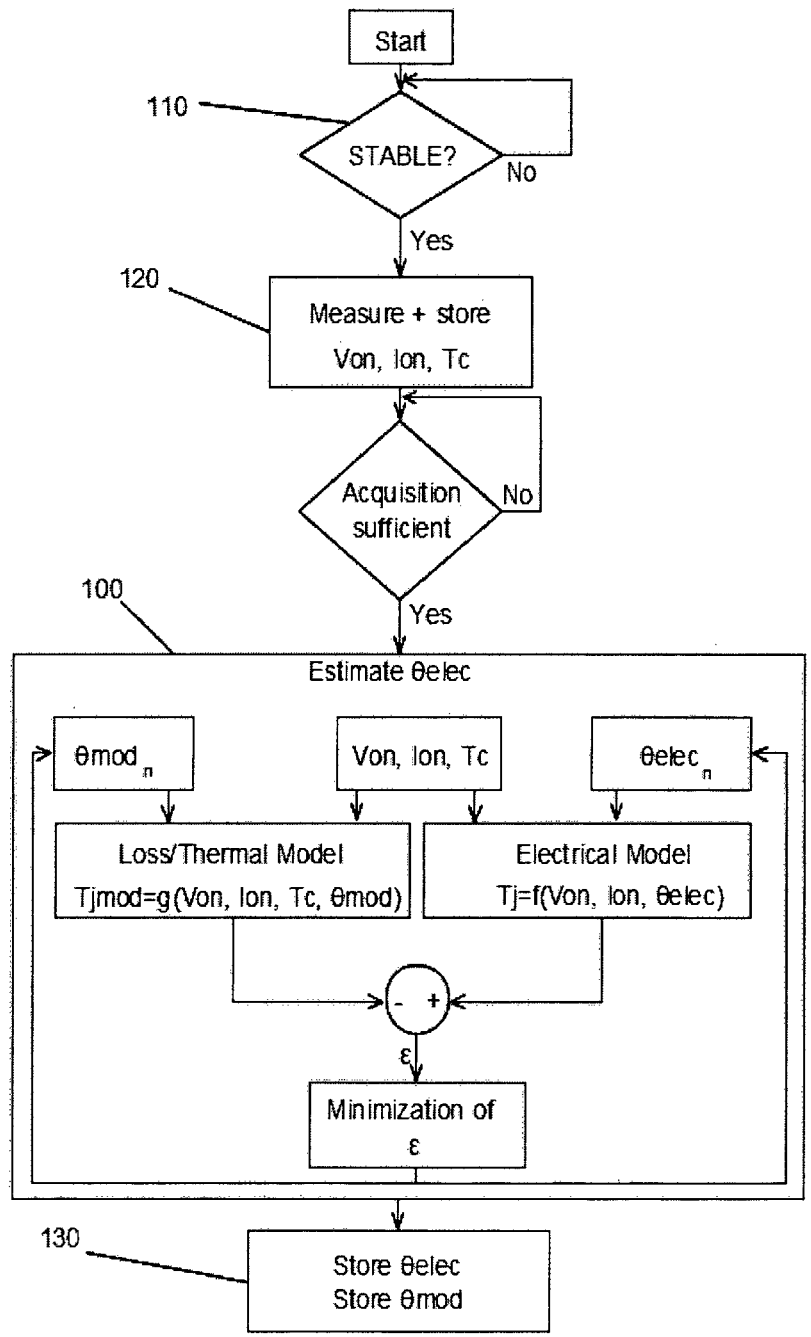
FIG. 3 is a schematic flowchart of an estimation process of the present disclosure.

In order to proceed to the calculation of minimization of error in the calibration phase, as described in FIG. 3, the process or method comprises:

- Detecting a stable operating condition, e.g. an on-line operation condition where Tc is stabilized;
- Measuring and storing at least one parameter set (Von, Ion, Tc) where Ion is a current for which the on-state voltage Von is sensitive to the temperature;
- Estimating at least one set of parameters θelec and at least one parameter θ mod through the method of finding the parameters that minimizes the error between the temperature estimation Tj generated by an electrical model and another temperature estimation Tjmod generated by a loss/thermal model;
- Storing the at least one parameters set θelec and/or θ mod.

In addition the calculated junction may be stored for further comparisons or temperature monitoring or processing and provided to the monitoring unit for display or transmitted to a remote monitoring center.

Detecting a Stable Operating Condition

Detecting a stable operating condition is performed by detecting unchanged operating condition during a time interval that is superior to the highest thermal time constant of the power semi-conductor module between the die of the power semi-conductor and the case temperature sensor as known from the structure of the module, giving the value Tc. The case temperature sensor can be positioned on the baseplate of the power semi-conductor module, which is the most frequent, or on a baseplate external to the power semi-conductor module, or in the heatsink to which the power semi-conductor module is thermally connected. The time constant is typically superior to 0.1 s, and can reach several hundreds of seconds in the case the temperature sensor is for example sensing the water temperature of a water-cooled heat-sink.

The operating condition is defined by at least Tc itself, and the current Inns through the semi-conductor, which is indicative of the losses in the die. In case of an alternating current, the rms current or peak current can be used. Other higher-level operating conditions such as the reference current, reference voltage, reference motor speed, reference motor torque can also be considered as providing valuable operating conditions.

Measuring and Storing

The measuring of a (Von, Ion, Tc) data set is performed by means of at least one Von sensor 2, one current sensor 3, and one case temperature sensor 4. In case of absence of physical sensor, virtual sensors such as estimators can be used. Every observed set is not of interest for the following estimation. Thus, the measuring may only store sets that were either not observed before, or that are identified to be of most interest. For some applications, sets with a given pre-defined current Ion may be of most interest, or sets showing significant variations of Von, Tc and/or Irms, as the losses in the power-semiconductor are linked to Irms, may be of most interest.

Ion is typically the load current at a certain moment when the power semi-conductor is in on-state and the Von is acquired. Ion is linked to Irms. Irms is the output DC current in case of DC-DC converters and Irms is related to the peak current of the converter in case of alternative current converters.

Von sensor may be of various kinds as presented in the literature. The preferred implementation is using a R-D clamp circuit composed of a resistor and diode in series. The resistor limits the current during device off-state when the diode clamps the voltage. This type of circuit has a certain time-delay and the Von is typically sampled after stabilization or quasi-stabilization of the voltage. In case of quasi-stabilization, the offset (typically few mV) will be corrected during the in-situ calibration.

Electrical Model

For a known current, the objective of the calibration with on-line data can be summarized as estimating the value V0 and "a" in equation (1). "a" is the temperature sensitivity, and V0 is the voltage at a reference temperature T0. Equation (1) assumes that temperature sensitivity "a" is constant and temperature-independent for a given current, which can generally be assumed to be the case for IGBTs. In equation (1), V0 comprises both the zero-current voltage and the voltage corresponding to the voltage drop in the resistive component.

$$Von = V0 + a \cdot (Tj - T0) \quad (1)$$

Equation (1) can also be written as:

$$Tj = \frac{Von - V0}{a} + T0 \quad (2)$$

In this equation the parameters θelec to be found is (a, V0):
  "a", the temperature sensitivity of Von (in mV/° C.) at a given current Ion. For example a=+4 mV/° C. at 10A;
  "V0", the value of Von at an absolute reference temperature T0 and a given current Ion. For example V0=1.1V at 25° C. at 10A.

The electrical model can also be expressed $Tj = T0 + \alpha_{Ion} \cdot (Von - V0_{Ion})$ measured at a certain Ion. In such case the calibration method estimates the θelec parameters $\alpha_{Ion}$ and $V0_{Ion}$ of the electrical model, where $\alpha_{ion}$ is the temperature sensitivity of Von for a pre-defined current Ion and $V0_{Ion}$ is the voltage at a pre-defined reference temperature T0 and a pre-defined current Ion.

For some components such as IGBTs and diodes, "a" can further be approximated to be linear with current:

$$a = h \cdot Ion + k \quad (3)$$

In addition, in some current region (also called resistive region), V0 can be considered to be linear with current for most diodes, IGBTs and MOSFETs:

$$V0 = f \cdot Ion + g \quad (4)$$

Thus, with several assumptions of linearity, one general example of equation for the temperature estimated by the electrical model is:

$$Tj = \frac{Von - f \cdot Ion - g}{h \cdot Ion + k} + T0 \quad (5)$$

In this case, the unknown θelec parameters set becomes (f, g, h, k).

It should be noted that equation (5) may be replaced by other equations in case a more accurate reading is needed and the θelec parameters will reflect the parameters of such equations.

According to the present disclosure, the set of parameters θelec may then have one or more parameters according to expected accuracy of the equation used.

Loss and Thermal Models

There are two ways of identifying the losses. In a preferred implementation, the RMS current is measured or calculated, and the loss model uses this value as a variable.

Typically, Ion can be the peak current, or the rms current, or a value proportional to the peak or the rms current such as $Ion = P_1 \cdot Irms$ or $Ion = P_2 \cdot Ipk$ with $P_1$ and $P_2$ known or identifiable by methods of the prior art. This estimation is based on a model equation with unknown parameters θ mod.

A general equation for Tjmod could then be expressed as $$Tj\,mod = H(Irms) + Tc \quad (6)$$

where H defines a function of Irms.

The losses in the power semi-conductor include switching and conduction losses. When combined with a steady-state thermal model and expressed as a function of current Irms (current generating losses, i.e. average or rms, or peak), Von, and Tc only, one example of expression of the estimated junction temperature Tjmod can be:

$$Tj\,mod = c + d \cdot Irms + e \cdot Irms^2 + Tc \quad (6a)$$

$$Tj\,mod = c' + d' \cdot Irms + e' \cdot Vonrms \cdot Irms + Tc \quad (6b)$$

with the parameters set θ mod=(c, d, e) or (c', d', e'). These parameters depend on the power module characteristics, its operating conditions (e.g. modulation index, cos (p), and thermal characteristics.

Vonrms is an equivalent Von that has significance in terms of conduction loss, and that can be typically assumed to derive directly from the measured Von. For example, in the case of a DC-DC converter generating a constant current, Vonrms=Von.

Irms can be estimated from Ion.

The thermal models are typically expressed using the thermal resistance Rth in Kelvin per Watt such that ΔT=Rth·losses. The expressions (6a), (6b) are similar if we consider the losses to be proportional to Irms and Vonrms·Irms or Irms$^2$, for example losses=d"·Irms+ e"·Irms$^2$.

According to the present disclosure, the set of parameters θ mod may then have one or more parameters according to the expected accuracy of the equation used.

Estimation of Models

The estimation is an important point of the invention, and is introduced by FIG. 2. It is based on comparing the temperature estimate Tjmod provided by the loss and thermal model, to the estimate provided by the electrical model Tj=F(Von, Ion, θelec), at a given and known current Ion and measured Von.

The parameter set θelec will typically allow to determine:

The temperature sensitivity of Von (in mV/° C.) at a given current Ion.

The value of Von at an absolute reference temperature and at a given current, for example Von=1.1V at 25° C. at 10A as discussed here above.

Storing the estimated θelec parameter set according to the equation used is necessary so that the calibration can later be used for filtering (e.g. through averaging), degradation estimation and/or temperature estimation in subsequent measurements assuming that θelec parameters remains constant.

In one example of a mode of implementation based on equations (5) and (6a), the error ε can thus be expressed as:

$$\varepsilon = \frac{Von - f \cdot \text{Ion} - g}{h \cdot \text{Ion} + k} + T0 - c - d \cdot I\,\text{rms} - e \cdot I\,\text{rms}^2 - Tc \quad (7)$$

In this case, the estimation method estimates θelec=(f, g, h, k), T0 being pre-defined, and Von, Irms, Ion and Tc being measured.

A number N (N>to the total number of unknown) of different sets (Von, Ion, Tc, Irms) are acquired, generating a system of N equations that allows estimating at least the unknowns θelec through minimization of ε.

One example of minimization algorithm as introduced in FIG. 2 is to scan various combinations of parameters, and to select the combination that presents the lowest error ε or when ε is lower than a predefined limit. Of course, more elaborated methods based on error minimization are possible.

Another way of estimating the parameters is to analytically resolve the system of N equations with ε=0 (zero forcing). The following examples will be based on this method for the sake of simplicity.

Estimation with MMSE and Reduced Data Storage

For the identification of model parameters, another method consists in using MMSE (Minimum Mean Square Error) instead of ZF (Zero Forcing). Such method consists in finding model parameters which together minimize the square error between 2 models over a set of P measurements.

As an example, to ease computability and readability, the model from equation (7) can be linearized as $$T_{J_3} \approx lV_{on} + mV_{on}I_{on} + nI_{on} + o + T_o$$

Parameters of linearized model are easily reached through first order development=1/k; m=−h/k$^2$; n=−f/k; o=−g/k. MMSE consists in finding the parameters of models over P measurements, which minimizes the quadratic error Ω between such models:

$$\Omega = \sum_{p \leq P} (T_{J_{3_p}} - T_{J_{1_p}})^2$$

$$= \sum_{p \leq P} (c + dI_{rms,p} + eI_{rms,p}V_{rms,p} + T_{c,p} - 1V_{on,p} - mV_{on,p}I_{on,p} - nI_{on,p} - o - T_0)^2$$

It should be noted that parameters o, c can be determined at reference temperature $T_o$ in idle state, where $T_j=T_c=T_o$, in absence of conducting/switching losses $$c=0; o=−(lV_{on0}+mV_{on0}I_{on0}+nI_{on0})$$

Then quadratic error can be rewritten in a generalized way as $\Omega=\Sigma_{p \leq P}(\Sigma_j\, a_j M_{j,p}−C)^2$, where A is a vector containing model parameters, $M_{j,p}$ are measurement results, C is a constant.

$$A=(a_1,a_2,a_3,a_4,a_5,a_6)=(1,d,e,l,m,n)$$

$$(M_{1,p},M_{2,p},M_{3,p},M_{4,p},M_{5,p},M_{6,p})=(T_{c,k},I_{rms,p},I_{rms,p}V_{rms,p},V_{on0}−V_{on,p},V_{on0}I_{on0}−V_{on,p}I_{on,p},I_{on,0}−I_{on,p})$$

$$C=T_o$$

The optimum set A of unknown model parameters $a_k$ must verity $$\frac{d\Omega}{da_k} = 0 \forall k,$$

from which yields $$\frac{d\Omega}{da_k} = \sum_j a_j \sum_{p \leq P} 2M_{j,k}M_{j,p} - 2CP = 2P\left(\sum_j a_j b_{jk} - C\right) = 0$$

where $b_{jk}$ are observation moments built from successive measurements:

$$b_{jk} = \frac{1}{P}\sum_{p \leq P} M_{j,k}M_{j,p}$$

The optimum condition be rewritten as a matrix product, from which we can identify the desired parameter set:

$$BA^T = C\begin{bmatrix}1\\ \vdots \\ 1\end{bmatrix}$$

The determination of parameters A allows determining the parameters in equation (7).

Benefits of MMSE Method

The method does not need to store past measurements. Only moments $b_{jk}$ and number P need to be incrementally updated at each new measurement to obtain 6×6+1 values. This results in huge savings in required storage.

Iterative computation is very simple, and independent on the number of processed measurement samples. Searching large measurement database is not needed which provides a huge savings in CPU power.

As soon as matrix B becomes nonsingular, the parameters can be estimated. There is no need to wait for special operating conditions to occur (e.g. same Ion, different Tc, etc). The acquisition of model parameters is thus faster and more reliable.

Estimation of Von Sensitivity

Considering again equation (7) with the above assumptions, $\varepsilon=0$, and e small, the following can be generated:

$$a = \frac{\Delta Von}{\Delta Tj} = \frac{Von2 - Von1}{Tj2 - Tj1} = \frac{Von2 - Von1}{Tj \bmod 2 - Tj \bmod 1} \approx \frac{Von2 - Von1}{Tc2 - Tc1} \quad (8)$$

This simple example shows the feasibility of estimating the temperature sensitivity of Von at a certain current using two quadruples only.

In practice, the temperature sensitivity of Von impacts the temperature difference such that:

$$Tj \bmod 2 - Tj \bmod 1 = Tc2 - Tc1 + e \cdot (Von \text{ rms } 2 - Von \text{ rms } 1) \cdot I \text{rms} \quad (9)$$

$$Tc2 - Tc1 + \varepsilon 2$$

$$\frac{aest}{areal} = \frac{Tc2 - Tc1 + e \cdot (Von \text{ rms } 2}{Tc2 - Tc1} = \frac{Tc2 - Tc1 + \varepsilon 2}{Tc2 - Tc1} \quad (10)$$

With $\varepsilon 2$ being an error proportional to (Von2–Von1). In order to improve the calibration accuracy, it is theoretically possible to estimate and correct for the error $\varepsilon 2$. It requires estimating the conduction losses associated to Von2 and Von1, which necessitates estimation of e which may be provided from the component datasheet information.

Measuring the temperature sensitivity "a" at two current values IonA and IonB allows identifying the parameters h and k of equation (3). In some case where (3) can't be assumed, for example if "a" varies with current with a 2nd order polynomial, performing at least 3 times the minimization of quadratic error method allows defining "a" for any current value. h and k can then be estimated analytically or with fitting.

Another example is to combine the estimation of "a" at one point with the result of a ZTC current estimation, which is the current for which the parameter "a" is null. ZTC estimation methods are described in the prior art.

In some case where "a" varies with the junction temperature Tj, the method can be performed a first time, then V0 can be performed for Tj estimation, and the result of alfa estimation can be re-actualised with respect to the estimated Tj. Several number of iteration can be necessary in order to reach a satisfying result.

Estimation of V0 Using 2 Measurements at the Same Current but Different Operating Conditions In this method, at least 2 sets (Von1, Ion1, Tc1, Irms1) and (Von2, Ion2, Tc2, Irms2) are monitored. With Ion1=Ion2, Tc1=Tc2, and Irms1≠Irms2, and where θelec is the value V0 of Von at the current Ion=Ion1=Ion2 and at a pre-defined temperature value T0.

This method is mostly applicable to inverter or PFC where operation at different RMS current is compatible with measurement at identical measurement current thanks to the sinusoidal wave of the current.

In practice, the monitoring is performed with the following protocol:

Detecting a first moment when the load current equals the pre-defined current Ion=Ion1, and saving a first Von1 at this first moment;

Detecting at least a second moment when the load current equals the pre-defined current Ion=Ion2=Ion1, the case temperature Tc2=Tc1, and Von at this different moment is different than Von measured at the first moment, and saving a second Von at this second moment.

Thus, in this case, the condition Irms1≠Irms2 is ensured through the condition Von1≠Von2.

In the case of bipolar devices such as IGBT and PIN diodes, the pre-defined current value is typically selected based on the following criteria:

Low sensitivity of Von to the current;

Sensitivity of Von with temperature;

Low current to facilitate calibration without the presence of self-heating and for limiting the contribution of the interconnection on Von.

For example, for a 150 A IGBT device, the pre-defined current value would typically be between 1.5 A (1% of nominal rated current) and 15 A (10% of nominal rated current).

Note that the condition Ion1=Ion2 is not a strict definition of the equality. For example, Ion1=Ion2±10% is acceptable. The criteria for detecting when the load current equals the pre-defined current value may be for example when the load current equals the pre-defined current value±10% of the pre-defined current value. Thus, sufficient detection can occur, and the error in Von due to the difference between the pre-defined current value and the load current value is minimized.

Example

In one example of implementation, the parameters c and e of equations (6) and (7) are neglected, E is assumed to be zero, and the following equation is derived:

$$0 = \frac{Von - V0}{a} + T0 - d \cdot I \text{rms} - Tc \quad (11)$$

Assuming "a" is previously identified using for example the previous method; the only unknowns are V0 and d. The two equations generated by the 2 quadruples constitute a system that can be solved to estimate these two parameters.

Estimation of V0 Using 3 Measurements at Different Operating Conditions

This method comprises estimating the temperature sensitivity of Von, parameter "a" in equation (1) for N>2 currents. This can be done through measuring Von at two currents and interpolate the results to find the N−2 remaining currents.

The N«V0» for each current are estimated in equation 1 with the hypothesis that equation V0=H(Ion) is linear.

This permits, with respect to the equations $Von = V0 + a \cdot (Tj - T0)$ or $Tj = T0 + \alpha_{Ion} \cdot (Von - V0_{Ion})$ to define the temperature sensitivity "a" or "$\alpha_{Ion}$" for N currents Ion; (i=1:N) and for M sets of measurements where M≥N. $V0_i$ (i=1:N) are then calculated by minimizing the error between Tj estimated by the electrical model and Tj estimated by said thermal model and $V0_i$ are stored or compared it to a reference value to survey possible degradation of the junction.

In this method, at least 3 sets (Von1, Ion1, Tc1), (Von2, Ion2, Tc2) and (Von3, Ion3, Tc3) are monitored with Ion1≠Ion2≠Ion3, and Tc1≠Tc2≠Tc3. Estimating the temperature of the junction of a semi-conductor element where the current Ion is proportional with a known factor to the peak or RMS current and the loss model is expressed as a function of this peak or RMS current is done with:

- generating at least two estimations that are based on the minimization of the error between the electrical model and the loss/thermal model;
- estimating the temperature sensitivity of Von for at least 3 currents Ion1, Ion2, Ion3, by performing at least two times the process of selecting and using at least two sets (Von1, Ion1 proportional to Irms1, Tc1) and (Von2, Ion2 proportional to Irms2, Tc2) with Ion1=Ion2; Irms1=Irms2 and Tc1≠Tc2;
- estimating the Von voltages Von01, Von02 and Von03 at the reference temperature T0 and for at least three currents Ion1, Ion2, and Ion3 by selecting and using at least three sets (Von1, Ion1 proportional to Irms1, Tc1), (Von2, Ion2 proportional to Irms2, Tc2) and (Von3, Ion3 proportional to Irms3, Tc3) where Tc1≠Tc2≠Tc3 or Irms1≠Irms2≠Irms3. This method is applicable to DC/DC converters where operation at different RMS current is not compatible with measurement at identical measurement current because of the constant DC current at a certain operating regime. The load current should however vary and present 3 distinct values during sufficiently long times to permit thermal stabilization.

Example

In the following example, the assumption of linear static characteristic curve at the reference temperature T0 (4) is used. In other words, for a reference temperature T0, three Von values measured at three current Ion1, Ion2, and Ion3 would be positioned on a line on a V(I) graph. This translates into the following equation:

$$Von01(Ion2-Ion3)+Von02(Ion3-Ion1)+Von03(Ion1-Ion2)=0 \quad (12)$$

With Von01 the Von at reference temperature T0 and current Ion1, Von02 the Von at reference temperature T0 and current Ion2, Von03 the Von at reference temperature T0 and current Ion3.

This assumes a resistive region in the static curve, which is typically present on MOSFETs, and also on IGBTs and diodes at sufficiently high currents. If this relation is more complex and can be expressed by a higher order polynomial, more measurements must be performed in order to identify the additional unknowns.

Now expressing the temperature sensitivity of Von as in (1) at three different current values:

$$Von01=Von1-a1(Tj1-T0)$$

$$Von02=Von2-a2(Tj2-T0)$$

$$Von03=Von3-a3(Tj3-T0) \quad (13)$$

a1, a2, and a3 being found for example by the method previously presented.

In the case of a DC/DC converter with Ion=Irms, and assuming the linearity of the thermal model (i.e. the parameters c and e of equations (6) and (7) are neglected), the 3 following equations can be expressed:

$$Tj1-Tc=d*Irms1$$

$$Tj2-Tc=d*Irms2$$

$$Tj3-Tc=d*Irms3 \quad (14)$$

Resolving the system of 7 unknowns (Von01, Von02, Von03, Tj1, Tj2, Tj3, d) and 7 equations (11)-(13), the parameter d can be expressed as:

$$d = \frac{(Von1 - a1 \cdot Tc) \cdot (I3 - I2) + (Von2 - a2 \cdot Tc) \cdot (I1 - I3) + (Von3 - a3 \cdot Tc) \cdot (I2 - I1)}{a1 \cdot I1(I3 - I2) + a2 \cdot I2(I1 - I3) + a3 \cdot I3(I2 - I1)} \quad (15)$$

Thus, for the three currents Ion1, Ion2 and Ion3, the temperature Tj1, Tj2 and Tj3 can be estimated using (13) and the voltages Von01, Von02 and Von03 at the reference temperature T0 can be estimated using (12).

In practice, the isothermal static characteristic is not necessarily linear. In some case such as for some IGBTs, it can be expressed with minimal error in a region of operation in the form of a power low such as:

$$Von0(I)=a \cdot I^\alpha + b \quad (15')$$

The additional parameter $\alpha$ can for example, be determined with prior calibration.

In addition, if the temperature increase c at zero current is not negligible, but is known from previous calibration, it can easily be incorporated into the definition of (14).

Overall, and with the objective to show that the presented implementation is only an example of a more general method, (14) can be expressed as follows with the addition of $\alpha$ and c:

$$d = \frac{(V1 - a1 \cdot (Tc + c)) \cdot (I3^\alpha - I2^\alpha) + (V2 - a2 \cdot (Tc + c)) \cdot (I1^\alpha - I3^\alpha) + (V3 - a3 \cdot (Tc + c)) \cdot (I2^\alpha - I1^\alpha)}{(a1 \cdot I1(I3 - I2) + a2 \cdot I2(I1 - I3) + a3 \cdot I3(I2 - I1))} \quad (15'')$$

Where Von1, Von2, Von3 were replaced intentionally by V1, V2, V3 for presentation reasons.

Estimation of Degradation

The calculated parameters are susceptible to evolve with ageing of the power semi-conductor module. For example, the degradation of top-side metallization, or of the top-side interconnection (e.g. wire-bonds), or of the bottom-side interconnection (e.g. solder) may change the parameters θelec and/or θ mod that provide minimization of error. Degradation in the semi-conductor die such as gate oxide degradation, or cell passivation may also lead to the evolution of the parameters θelec and/or θ mod.

For example, in the simplified example of (1), V0 at high current would likely change with wire-bond lift-off as a result of the increase of f in (4). For example, in the example with equation (6a), c, d and e would likely change with solder degradation, that is known to impact the thermal path.

Comparing initial stored θelec and/or θ mod data with θelec and/or θ mod data through the life of the semi-conductor permits to provide warnings when a variation is above a certain limit.

Figure 4:
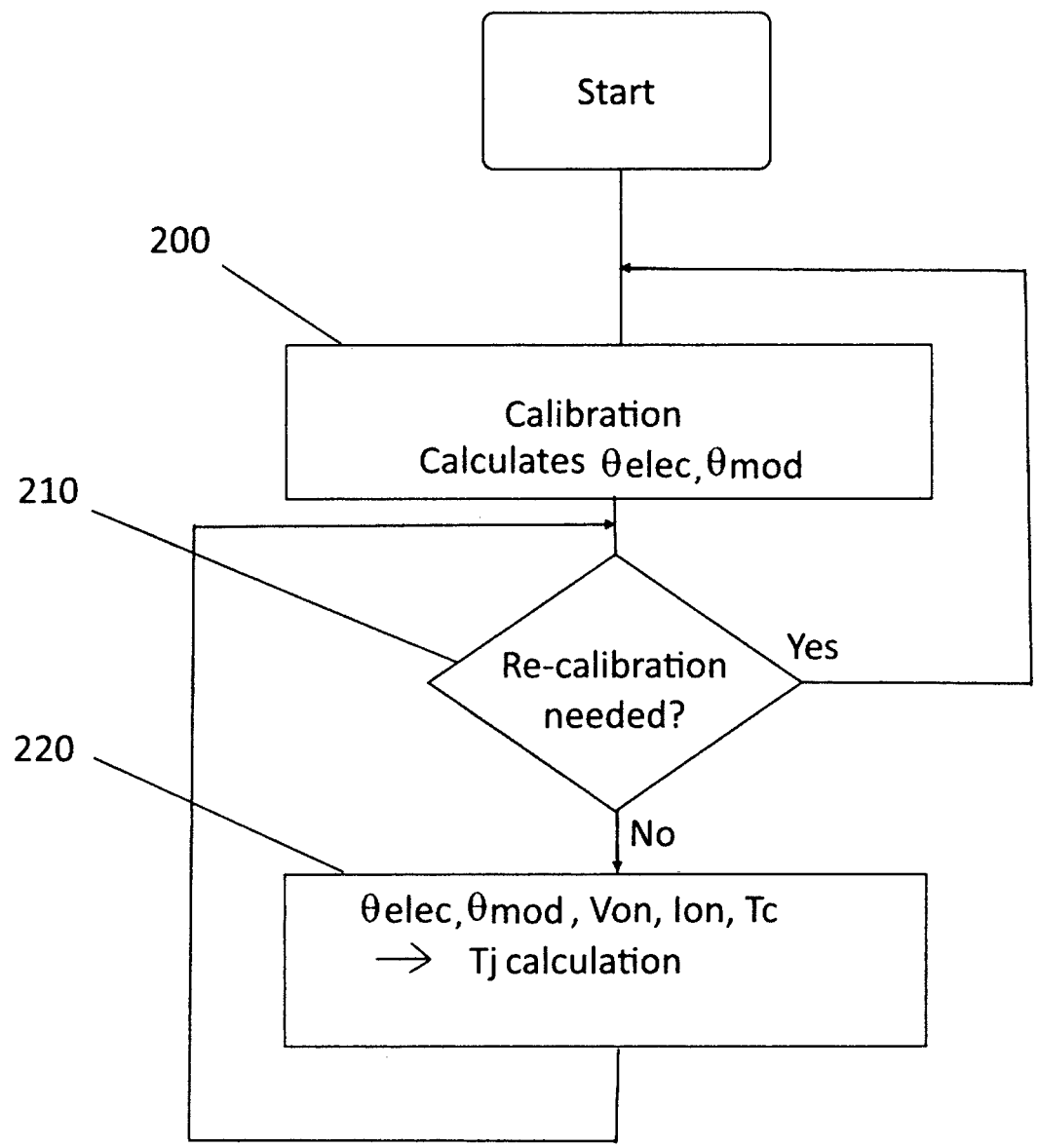
FIG. 4 is a schematic flowchart of a Tj calculation process of the disclosure.

Estimation of Temperature:

According to FIG. 4, the calibration method 100 of FIG. 3 is used to obtain the calibration data θelec during monitoring at a first moment in time 200 and a set of parameters. This set of parameters and on-line measurements of Von and Ion at another moment in time 220 together with the equation Tj=F(Von, Ion, θelec) are used to estimate the junction temperature Tj at said another moment in time. A counter 210 such as time counter or kWh counter initiates further recalibrations and new measurements processes during life of the power-component.

These measurements can be done in the monitoring unit 5 which stores past values and compares such with actual values or remotely in a monitoring center which stores the data of several units and provides maintenance warnings for such units.

The application of the invention may be wind turbines current converters or any other high power voltage or current converters for motors or generators such as used in electric vehicles.

The invention claimed is:

1. A Method for estimating parameters of a junction of a power semi-conductor element comprising:
   detecting at least one stable on-line operating condition through measurements of Von, Ion, Tc on said power semi-conductor element where Ion is a current for which on-state voltage Von of said power semi-conductor element is temperature sensitive and Tc is the temperature of the casing of said power semi-conductor element;
   measuring and storing at least one set of parameters Von, Ion, Tc of said at least one stable operating condition;
   minimizing error between a junction temperature estimation Tj of an electrical model Tj=F(Von, Ion, θelec) comprising a first set of unknown parameters θelec and another junction temperature estimation Tjmod of a thermal model Tjmod=G (Ion, Tc, θ mod) comprising a second set of unknown parameters θ mod and obtaining at least one set of parameters θelec and at least one set of parameters θ mod providing minimization of said error;
   providing the calculated value of Tj with at least one of the calculated sets of parameters θelec and/or θ mod, and the measured Von, Ion, Tc;
   storing the at least one set of parameters θelec and/or θ mod and/or Tj; and
   estimating the parameters of the junction by comparing the stored at least one set of parameters θelec and/or θ mod and/or Tj, with the at least one set of parameters at another moment in time to provide maintenance warnings.

2. The method for estimating parameters of a junction of a power semi-conductor element according to claim 1 wherein said step of minimizing error comprises an algorithm that scans various combinations of said sets of parameters and selects the combination that presents an error ε lower than a defined limit value.

3. The method for estimating parameters of a junction of a power semi-conductor element according to claim 1 further comprising:
   providing a set of N on-line measurements of Von, Ion, Tc, Irms, the root mean square value of Ion, sufficient to generate a system of N equations where N is greater than or equal to the number of parameters of θelec and θ mod together and comprising calculating the unknowns θelec through an analytical calculation algorithm that solves the N equations.

4. The method for estimating parameters of a junction of a power semi-conductor element according to claim 1, wherein said step of minimizing error comprises minimizing the sum, over a set of on-line measurements (P), of square errors between said electrical model and said thermal model by the estimated sets of parameters.

5. The method for estimating parameters of a junction of a power semiconductor element according to claim 4, further comprising:
   initializing a uniform vector during a first measurement in absence of power,
   computing, incrementing and storing moments of correlation between the on-line measurements; and
   identifying the estimated parameters as the product of the inverse matrix of the moments of correlation with said uniform vector.

6. The method for estimating parameters of a junction of a power semi-conductor element according to claim 1 wherein the electrical model is of a form $$Tj = T0 + \frac{Von - V0}{a}$$

and wherein the thermal model is of the simplified form

Tj mod=H(Irms)+Tc where T0 is a reference temperature, V0 is the Von voltage at said reference temperature T0, "a" is the temperature sensitivity of Von, Tj is the die temperature of said power semi-conductor element, H defines a function of Irms according to the type of power semi-conductor used, Irms is estimated from Ion and Tc is measured.

7. The method for estimating parameters of a junction of a power semi-conductor element according to claim 1, where the electrical model is of the form $Tj=T0+\alpha_{Ion} \cdot (Von-V0_{Ion})$ measured at a certain Ion, the method comprising said error minimizing calculations of claim 1 to estimate the parameters $\alpha_{Ion}$ and $V0_{Ion}$ of the electrical model, where $\alpha_{Ion}$ is the temperature sensitivity of Von for a pre-defined current Ion and $V0_{Ion}$ is the voltage at a pre-defined reference temperature T0 and said pre-defined current Ion.

8. The method for estimating parameters of a junction of a power semi-conductor element according to claim 6, where the temperature sensitivity of Von is defined for N currents Ion; i=1: N and for M sets of measurements where M≥N, and where the method comprises identifying $V0_i=V0_{Ion}$ for i=1: N by minimizing the error between Tj estimated by the electrical model and Tj estimated by said thermal model.

9. The method for estimating parameters of a junction of a power semi-conductor element according to claim 6 further comprising:
   estimating the voltage V0 using at least two measurements at the same current but different operating conditions wherein at least two sets Von1, Ion1, Tc1, Irms1 and Von2, Ion2, Tc2, Irms2 are monitored with Ion1=Ion2, Tc1=Tc2, and Irms1≠Irms2, and where a parameter of θelec is the value V0 of Von at the current Ion=Ion1=Ion2 and at the pre-defined temperature value T0 and wherein the monitoring is performed with the following protocol;
   detecting a first moment when a load current equals the pre-defined current Ion=Ion1, and saving a first Von being Von1 at this first moment; and
   detecting at least a second moment when said load current equals the pre-defined current Ion=Ion2=Ion1, the case temperature Tc2=Tc1, and Von at this second moment is different than Von measured at the first moment, and saving a second Von being Von2 at this second moment.

10. The method for estimating parameters of a junction of a power semi-conductor element according to claim 9, where the current Ion being proportional with a known factor to the peak or RMS current and the loss model being expressed as a function of this peak or RMS current, said method includes generating at least two estimations that are based on the minimization of the error between the electrical model and the thermal model and comprising:

estimating the temperature sensitivity of Von for at least 3 currents Ion1, Ion2, Ion3, by performing at least two times the process of selecting and using at least two sets Von1, Ion1 proportional to Irms1, Tc1 and Von2, Ion2 proportional to Irms2, Tc2 with Ion1=Ion2; Irms1=Irms2 and Tc1≠Tc2; and estimating the Von voltages Von01, Von02 and Von03 at the reference temperature T0 and at least three currents Ion1, Ion2, and Ion3 by selecting and using at least three sets Von1, Ion1 proportional to Irms1, Tc1, Von2, Ion2 proportional to Irms2, Tc2 and Von3, Ion3 proportional to Irms3, Tc3 where Tc1≠Tc2≠Tc3 or Irms1≠Irms2≠Irms3.

11. The method for estimating parameters of a junction of a power semi-conductor element according to claim 10, where the at least three currents Ion1, Ion2 and Ion3 are further chosen in a linear region of the static characteristic of said power semi-conductor element, such that the three points (Von01, Ion1), (Von02, Ion2), and (Von03, Ion3) at a same temperature are positioned on a same line.

12. A method for estimating a state of health of a power semi-conductor element comprising:

the method for estimating parameters of a junction of a power semi-conductor element according to claim 1, wherein the method is performed at different moments in time in the life of said power semi-conductor element, where the parameters θ mod of the thermal model provide at least a parameter representing a thermal resistance Rth stored during said moments in time, and where the evolution of Rth is used to access the state of health of said power semi-conductor element.

13. A method for estimating a state of health of a power semi-conductor element comprising:

the method for estimating parameters of a junction of a power semi-conductor element according to claim 1, where the temperature sensitivity of Von is defined for N currents $Ion_i$ i=1:N and for M sets of measurements where M≥N, and where the method comprises identifying $V0_i=V0_{Ion}$ for i=1: N by minimizing the error between Tj estimated by the electrical model and Tj estimated by said thermal model and wherein said method for estimating parameters is performed at different moments in time in the life of said power semi-conductor element, comprising storing at least one parameter $V0_i$ during these moments in time, and comprising a survey of the evolution of $V0_i$ to provide a diagnosis means of state of health of said power semi-conductor element.

14. A method for estimating a temperature of the junction of a power semi-conductor element comprising:

the method for estimating parameters of a junction of a power semi-conductor element according to claim 1, the estimating method comprising executing a calibration at a first moment in time of working of said power semi-conductor element, said calibration comprising calculating and storing a first set of $\theta elec_0$ parameters at said first moment in time and comprising computing at other moments in time the equation Tj=F(Von, Ion, θelec) with said first set of parameters $\theta elec_0$ and the on-line measurements of Von and Ion at said other moments in time to estimate the junction temperature at said other moments in time.

15. A method for estimating a temperature of the junction of a semi-conductor element comprising the method for estimating parameters of a junction of a power semi-conductor element according to claim 1 further comprising:

executing a first calibration at an initial moment in time of working of said power semi-conductor element, calculating and storing a first set of parameters $\theta \bmod_0$ at said initial moment in time and comprising computing, at other moments in time, the equation Tj=G (Ion, Tc, θ mod) with this set of parameters together with the on-line measurements of Von and Ion at said other moments in time and estimating the junction temperature at said other moments in time.

16. The method for estimating the temperature of the junction of a semi-conductor element according to claim 14 wherein said equation Tj=F(Von, Ion, θelec)

$$Tj = \frac{Von - f_\tau \cdot Ion - g}{h_\tau \cdot Ion + k} + T0,$$

θelec being the parameter set f, g, h, k.

17. A power unit comprising:
a power semi-conductor element;
sensors for sensing on-line Von, Ion and Tc of said power semi-conductor element; and
a calculation processor and a storage memory,
wherein the calculation processor receives measurements data from said sensors, and is configured to implement the method of claim 1.

18. The power unit according to claim 17 wherein said storage memory stores a measurement program that causes the calculation processor to schedule estimations of parameters of a junction of said power semi-conductor element during the life of said power semi-conductor element to detect potentially damaging Tj values and potential failures of said power semi-conductor element.

* * * * *